(12) United States Patent
Park et al.

(10) Patent No.: US 6,686,259 B2
(45) Date of Patent: Feb. 3, 2004

(54) METHOD FOR MANUFACTURING SOLID STATE IMAGE PICK-UP DEVICE

(75) Inventors: Sang-sik Park, Suwon (KR); Mikio Takagi, Yongin (KR); Jae-heon Choi, Suwon (KR); Sang-il Jung, Seoul (KR); Jun-taek Lee, Suwon (KR)

(73) Assignee: Samsung Electronics Co., Ltd. (KR)

( * ) Notice: Subject to any disclaimer, the term of this patent is extended or adjusted under 35 U.S.C. 154(b) by 72 days.

(21) Appl. No.: 09/994,507

(22) Filed: Nov. 27, 2001

(65) Prior Publication Data

US 2002/0127762 A1 Sep. 12, 2002

(30) Foreign Application Priority Data

Mar. 9, 2001 (KR) ........................................ 2001-12249

(51) Int. Cl.[7] ............................................. H01L 21/322
(52) U.S. Cl. ........................ 438/471; 438/476; 438/402
(58) Field of Search ................................. 438/471, 476, 438/115, 627, 643, 653, 310, 402

(56) References Cited

U.S. PATENT DOCUMENTS

| 4,472,212 A | * | 9/1984 | Kinsbron .................... 148/188 |
| 5,293,373 A | * | 3/1994 | Toide et al. .............. 369/275.5 |
| 5,432,363 A | * | 7/1995 | Kamisaka et al. .......... 257/233 |
| 6,300,680 B1 | * | 10/2001 | Horikawa et al. .......... 257/751 |
| 6,372,611 B1 | * | 4/2002 | Horikawa .................. 438/473 |

FOREIGN PATENT DOCUMENTS

KR      1993-0010673      11/1993

OTHER PUBLICATIONS

"3—3 Improvement of Shallow Base Transistor Technology by Using a Doped Poly–Silicon Diffusion Source", Takagi, et al., Supplement to the Journal of the Japan Society of Applied Physics, vol. 42, 1973, pp. 101–109.

* cited by examiner

Primary Examiner—Amir Zarabian
Assistant Examiner—Pamela Perkins
(74) Attorney, Agent, or Firm—Mills & Onello, LLP

(57) ABSTRACT

In a method for manufacturing a solid state image pick up device capable of improving gettering efficiency a semiconductor substrate having a front side on which a solid state image pick-up device may be formed, and a rear side opposite to the front side is provided. Subsequently, a polysilicon layer including impurities for gettering having a predetermined concentration is formed on the rear side of the semiconductor substrate. Next, a predetermined thickness of the polysilicon layer including the impurities for gettering is oxidized, and the impurities for gettering are condensed into the reduced polysilicon layer.

19 Claims, 2 Drawing Sheets

METHOD FOR MANUFACTURING SOLID STATE IMAGE PICK-UP DEVICE

BACKGROUND OF THE INVENTION

1. Field of the Invention

The present invention relates to a method for manufacturing a solid state image pick-up device, and more particularly, to a method for processing a substrate for improving gettering efficiency on which a solid state image pick-up device is formed.

2. Description of the Related Art

In general, solid state image pick-up devices are used in various fields including public welfare, industry, broadcasting, and munitions, and are applied to various electronic products such as cameras, camcorders, multimedia devices, and surveillance cameras. At present, as electronic products become smaller and the number of pixels of image data electronic products are required to receive and process is increased, demand for an on-chip type solid state image pick-up device having a microlens also increases.

Solid state image pick-up devices include charge coupled devices (CCD) and complementary metal oxide semiconductor (CMOS) devices. The CCD and CMOS solid state image pick-up devices can be integrated onto a silicon substrate.

However, during a process of forming a solid state image pick-up device, or prior to or following such a process, heavy metals such as iron (Fe), copper (Cu), and nickel (Ni) can penetrate into the rear side of the silicon substrate. When heavy metals penetrate into the rear side of the silicon substrate, crystalline defects occur on the silicon substrate, thereby resulting in the possibility of leakage current from the solid state image pick-up device. When such leakage current occurs, a dark level phenomenon causes a display screen to not look completely dark even though no light is detected by the solid state image pick-up device. Alternatively, in a case where there are heavy metal defects on the rear side of the silicon substrate, image defects such as white dots appear on a display screen.

At present, in order to prevent crystalline defects and image defects caused by heavy metal contamination, the substrate in the solid state image pick-up device is gettered. Gettering methods include an intrinsic gettering method and an extrinsic gettering method. The intrinsic gettering method is a method for thermally-processing a substrate at a predetermined temperature to remove defects and contamination. However, the intrinsic gettering method is accompanied by a high-temperature process, thus the intrinsic gettering method is not often used.

Meanwhile, the extrinsic gettering method is a method by which the rear side of a semiconductor substrate is heavily doped with phosphorus (P) ions. Here, due to doping with phosphorus (P)-ions, phosphorus vacancies and dislocation defects occur in the silicon substrate, and heavy metals gather at these phosphorus vacancies and dislocation defects. Here, in general, gettering efficiency is proportional to the concentration of phosphorus ions (P), and solid solubility of the substrate in silicon is defined, thus it is impossible to increase the concentration of P ions beyond the solid solubility of the substrate in silicon. As a result, heavy metal defects in the solid state image pick-up device cannot be removed by the gettering methods, thus image defects are still produced in a screen of the solid state image pick-up device.

SUMMARY OF THE INVENTION

To address the above limitations, it is a first objective of the present invention to provide a method for manufacturing a solid state image pick-up device capable of removing crystalline defects and image defects.

It is a second objective of the present invention to provide a method for manufacturing a solid state image pick-up device capable of further improving gettering efficiency by introducing the rear side of a semiconductor substrate with impurities for gettering beyond the solid solubility in silicon.

It is a third objective of the present invention to provide a method for manufacturing a solid state image pick-up device capable of preventing heavy metals from penetrating into a substrate on which the solid state image pick-up device is formed, thereby increasing the lifespan of the solid state image pick-up device.

Accordingly, to achieve the above objectives, according to one aspect of the present invention, there is provided a method for manufacturing a solid state image pick-up device. The method includes the following steps. First, a semiconductor substrate having a front side on which a solid state image pick-up device may be formed, and a rear side opposite to the front side is provided. Next, a polysilicon layer including impurities for gettering having a predetermined concentration is deposited, or otherwise formed, on the rear side of the semiconductor substrate. Last, the thickness of the polysilicon layer including the impurities for gettering is reduced, thereby condensing the impurities for gettering into the reduced polysilicon layer. It is preferable that the step of reducing the thickness of the polysilicon layer is performed by oxidizing a predetermined thickness of the polysilicon layer In order to achieve the above objectives, according to another aspect of the present invention, there is provided a method for manufacturing a solid state image pick-up device. The method includes the following steps. First, a semiconductor substrate having a front side on which a solid state image pick-up device may be formed, and a rear side opposite to the front side is provided. Next, a polysilicon layer including impurities for gettering having a predetermined concentration is formed on the rear side of the semiconductor substrate. Last, a predetermined thickness of the polysilicon layer including the impurities for gettering is oxidized, and the impurities for gettering are condensed into the reduced polysilicon layer. The step of oxidizing a predetermined thickness of the polysilicon layer is performed so that $\frac{1}{2}$ through $\frac{1}{10}$ of its deposition thickness of the polysilicon layer may remain.

In order to achieve the above objectives, according to still another aspect of the present invention, there is provided a method for manufacturing a solid state image pick-up device. The method includes the following steps. First, a semiconductor substrate having a front side on which a solid state image pick-up device may be formed, and a rear side opposite to the front side is provided. Next, a polysilicon layer including impurities for gettering having a predetermined concentration is deposited on the rear side of the semiconductor substrate. Next, a predetermined thickness of the polysilicon layer including the impurities for gettering is oxidized, and the impurities for gettering are condensed into the reduced polysilicon layer. Last, a protective layer is formed to cover the rear side of the semiconductor substrate.

It is preferable that the step of oxidizing the polysilicon layer to a predetermined thickness is performed by oxidizing the thickness of the polysilicon layer so that $\frac{1}{2}$ through $\frac{1}{10}$ of the entire thickness of the polysilicon layer may remain, and the impurities for gettering are phosphorus (P) ions, or arsenic (As) ions.

It is also preferable that the step of forming a polysilicon layer including impurities for gettering on the rear side of the semiconductor substrate includes the steps of depositing an intrinsic polysilicon layer on the rear side of the semiconductor substrate, and introducing the polysilicon layer with the impurities for gettering. It is also preferable that the step of introducing the polysilicon layer with the impurities for gettering is performed by ion implantation, doping, or diffusion.

It is also preferable that the step of forming a polysilicon layer including impurities for gettering, on the rear side of the semiconductor substrate is performed by depositing the polysilicon layer in which the impurities for gettering are doped, on the rear side of the semiconductor substrate by a chemical vapor deposition (CVD) method.

It is also preferable that the step of forming a polysilicon layer including impurities for gettering, on the rear side of the semiconductor substrate is performed by introducing the impurities for gettering to the solid solubility in silicon into the polysilicon layer, and the polysilicon layer has impurities concentration beyond the solid solubility in silicon by step for reducing the thickness of the polysilicon layer.

It is also preferable that the protective layer is formed of silicon nitride ($Si_3N_4$) or silicon oxynitride (SiON).

BRIEF DESCRIPTION OF THE DRAWINGS

The above objectives and advantages of the present invention will become more apparent by describing in detail preferred embodiments thereof with reference to the attached drawings in which.

DETAILED DESCRIPTION OF PREFERRED EMBODIMENTS

Hereinafter, the present invention will be described more fully with reference to the accompanying drawings in which preferred embodiments of the invention are shown.

Figure 1:
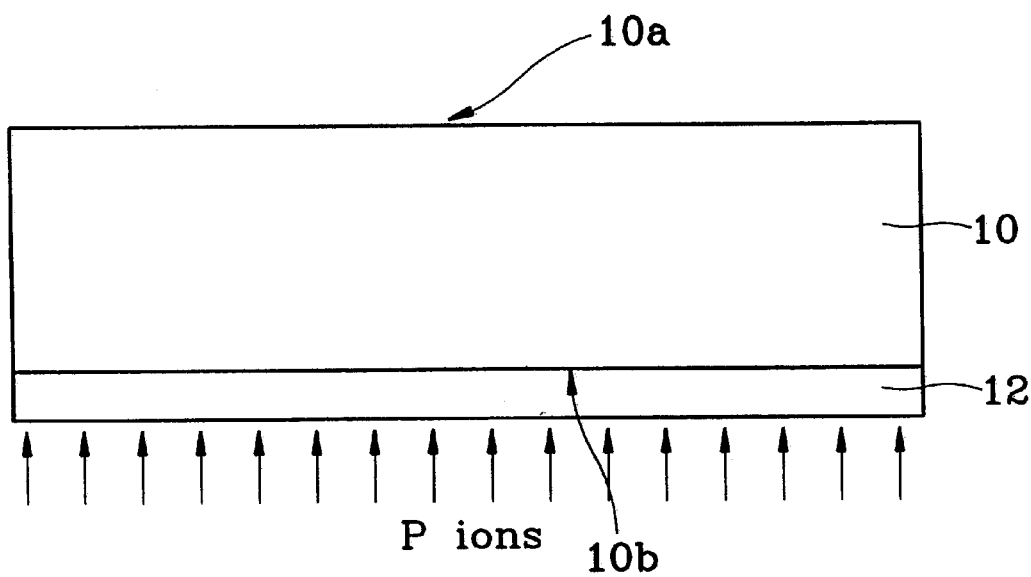
FIGS. 1 through 3 are sectional views illustrating each process in a method for manufacturing a solid state image pick-up device according to a first embodiment of the present invention.

First, referring to FIG. 1, a semiconductor substrate 10 for a solid state image pick-up device having a front side 10a and a rear side 10b is provided. Here, electrodes of the solid state image pick-up device will be formed on the front side 10a. Also, P-type or N-type impurities having a concentration of $10^{14}$–$10^{15}$/cm$^3$ are contained in the semiconductor substrate 10. A polysilicon layer 12 introduced with impurities for catching heavy metals (hereinafter referred to as impurities for gettering) is formed on the rear side 10b of the semiconductor substrate 10. In order to form the polysilicon layer 12 introduced with the impurities for gettering, first, a polysilicon layer (not shown) is formed by, for example, a chemical vapor deposition (CVD) method, at a temperature of 700° C. or less. Next, the impurities for gettering are introduced by a dose of the maximum amount that can be solved in silicon (solid solubility in silicon), preferably, by a concentration of $10^{20}$–$10^{21}$/cm$^3$, more preferably, by a concentration of $3\times10^{20}$/cm$^3$ through $5\times10^{20}$/cm$^3$. Here, phosphorus (P) or arsenic (As) ions can be used as the impurities for gettering. Also, an ion-implantation process, a doping process, or a diffusion process can be used as a method for introducing the polysilicon layer with the impurities for gettering.

Figure 2:
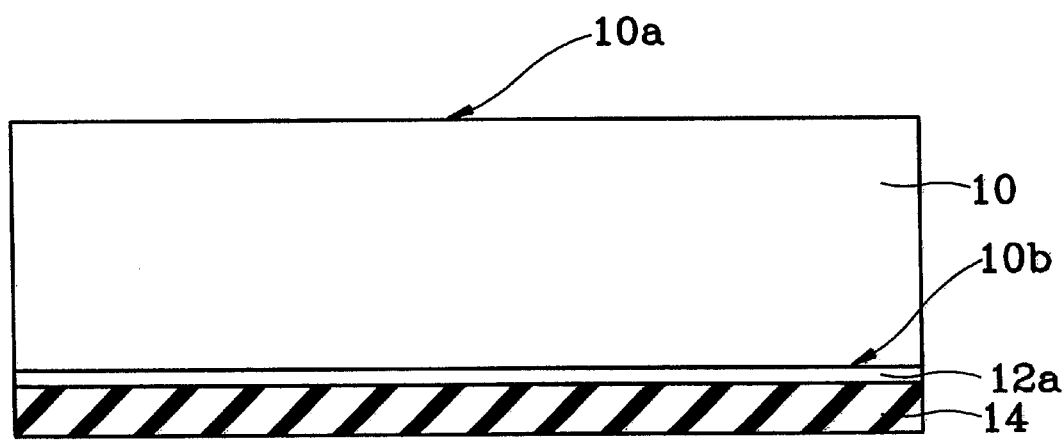

Next, as shown in FIG. 2, the polysilicon layer 12 introduced with the impurities for gettering is oxidized to a predetermined thickness, thereby reducing the thickness of the polysilicon layer 12. Here, the thickness of a reduced polysilicon layer 12a is preferably ½ through ⅒ of the deposition thickness of the polysilicon layer 12, more preferably, ⅓ through ⅕ of the deposition thickness of the polysilicon layer 12. If the thickness of the remaining polysilicon layer 12a is reduced by the oxidation process, the impurities for gettering with which the remaining polysilicon layer 12 is introduced before the oxidation process are collected into the polysilicon layer 12a resulting from the oxidization process. As a result, the concentration of the impurities for gettering remaining in the reduced polysilicon layer 12a is increased in proportion to the reduction in thickness of the polysilicon layer 12. More specifically, as is well-known, if the polysilicon layer 12 doped with the impurities is oxidized, only 1–2% of the impurities remain in the oxide layer 14 and most of the impurities penetrate into the reduced polysilicon layer 12a (see "The Journal of the Japan Society of Applied Physics", vol. 42, pp105–107, published in 1973). Here, even though the impurities for gettering are introduced in the polysilicon layer 12 to their solid solubility, they are forcibly introduced into the remaining polysilicon layer 12a during the oxidization process. According to this principle, the remaining polysilicon layer 12a in the first embodiment is introduced with the impurities for gettering beyond the solid solubility in polysilicon.

For example, if the thickness of the polysilicon layer 12 in the first embodiment is reduced by the oxidization process to one fourth of its deposition thickness, the concentration of the impurities in the remaining polysilicon layer 12a is increased to $1.2\times10^{21}$/cm$^3$ through $2\times10^{21}$/cm$^3$, four times as much as a concentration before the oxidization process. As a result, the impurities for gettering in the remaining polysilicon layer 12a diffuse into the adjacent semiconductor substrate 10, thus the concentration of the impurities on the rear side of the semiconductor substrate 10 is increased to $2\times10^{20}$/cm$^3$ through $3\times10^{20}$/cm$^3$. Here, since the remaining polysilicon layer 12a is silicon-based, as is the semiconductor substrate 10, the remaining polysilicon layer 12a in the first embodiment serves as the semiconductor substrate. As a result, the rear side of the semiconductor substrate 10 in the first embodiment has a region of the impurities for gettering having a predetermined depth beyond the solid solubility in silicon.

Figure 3:
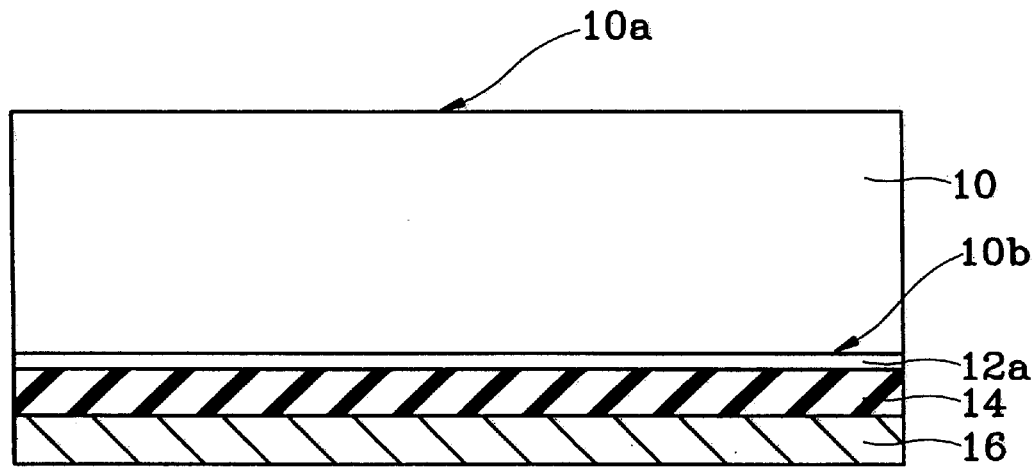

Next, as shown in FIG. 3, a protective layer 16 is formed on the surface of the oxide layer 14 formed on the rear side 10b of the semiconductor substrate. Here, the protective layer 16 prevents heavy metals and contaminants from penetrating into the rear side 10b of the substrate during a process. Further, the protective layer 16 prevents out-diffusion of the impurities doped on the rear side 10b of the substrate during subsequent processes. For example, Silicon nitride ($Si_3N_4$) and silicon oxynitride (SiON) can be used as the protective layer 16.

Here, the contamination and lifespan were measured for a solid state image pickup device configured according to the present invention in two cases, that is, a case where the protective layer is formed, and a case where the protective layer is not formed.

First, two semiconductor substrates after an oxidization process to reduce the polysilicon layer 12 were provided, and a protective layer 16 was formed on the rear side of only one of the semiconductor substrates and not on the rear side of the other semiconductor substrate. Next, each of the semiconductor substrates 10 were treated with a thermal process at about 1150° C. The amount of contaminants (heavy metals) doubled compared to before the thermal process for the semiconductor substrate 10 on which the protective layer 16 is formed, and the contaminants increased 60 times or more, as compared to before the thermal process for the semiconductor substrate 10 on which the protective layer 16 was not formed. Also, as a result of measuring the lifespan of solid state image pick-up devices having each of the semiconductor substrates 10, there was no change in the life time on the semiconductor substrate 10 on which the protective layer 16 was formed, and the lifespan of the solid state image pick-up device of the semiconductor substrate 10 on which the protective layer 16 was not formed was reduced to ⅓ that of the device having the protective layer 16. As a result, it is preferable that the protective layer 16 is formed on the rear side of the semiconductor substrate 10 in order to prevent an increase in contaminants and a decrease in lifespan.

According to the first embodiment, the polysilicon layer 12 doped with the impurities for gettering having the solid solubility in silicon is formed on the rear side of the semiconductor substrate 10. Next, the polysilicon layer 12 is oxidized to a predetermined thickness, thereby reducing the thickness of the polysilicon layer 12. Then, the impurities for gettering beyond the solid solubility in silicon are collected in the reduced polysilicon layer 12a, thereby increasing the concentration of the impurities for gettering in the semiconductor substrate 10 adjacent to the polysilicon layer 12a. As a result, gettering efficiency is considerably increased.

Further, the protective layer 16 is formed to cover the rear side of the semiconductor substrate. Due to the formation of the protective layer 16, during a subsequent thermal process, contaminants such as heavy metals do not penetrate into the rear side of the semiconductor substrate, and the lifespan is therefore not reduced.

Hereinafter, a second embodiment of the present invention will be described.

First, the polysilicon layer 12 excluding impurities in the above-mentioned first embodiment is deposited and then introduced with impurities for catching heavy metals by an ion-implantation method, a doping method, or a diffusion method.

Figure 4:
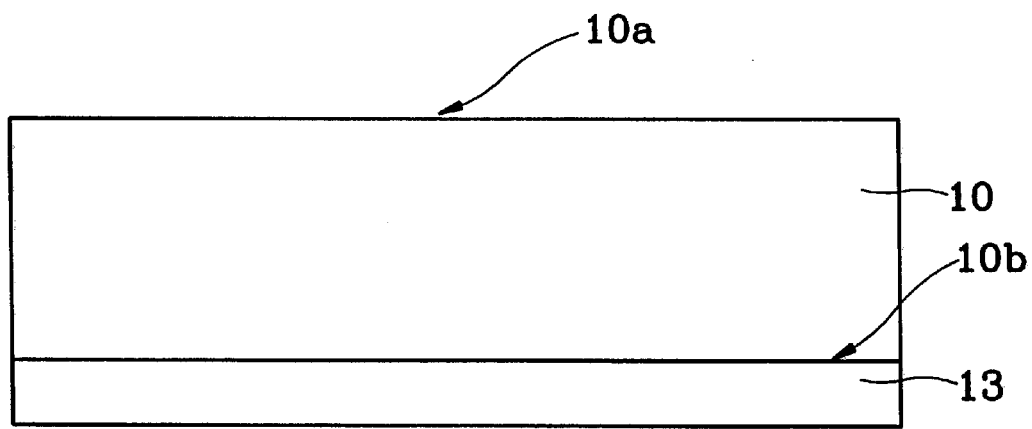
FIG. 4 is a sectional view illustrating a method for manufacturing a solid state image pick-up device according to a second embodiment of the present invention.

However, in the second embodiment, as shown in FIG. 4, the polysilicon layer 13 has already been doped with impurities for gettering before being deposited on a rear side 10b of a semiconductor substrate 10 for a solid state image pick-up device, by a CVD method, more preferably, a low pressure chemical vapor deposition (LPCVD) method. Here, as with the first embodiment, phosphorus (P) ions, or arsenic (As) ions can be used as the impurities for gettering, and the P-ions or As-ions are doped to a concentration of $3 \times 10^{20}/cm^3$ through $5 \times 10^{20}/cm^3$. Next, as with the first embodiment, the subsequent process is performed. Likewise, even through the doped polysilicon layer 13 is pre-doped, the same effect as that in the first embodiment can be obtained.

As described above, the polysilicon layer doped with the impurities for gettering having the solid solubility in silicon is formed on the rear side of the semiconductor substrate. Next, the polysilicon layer is oxidized to a predetermined thickness, thereby reducing the thickness of the polysilicon layer. Then, the impurities for gettering beyond the solid solubility in silicon are collected in the reduced polysilicon layer, thereby increasing the concentration of the impurities for gettering in the semiconductor substrate adjacent to the polysilicon layer. As a result, gettering efficiency is considerably increased.

Further, the protective layer is formed to cover the rear side of the semiconductor substrate. Due to the formation of the protective layer, during a subsequent thermal process, contaminants such as heavy metals do not penetrate into the rear side of the semiconductor substrate, and the lifespan is not reduced.

While this invention has been particularly shown and described with reference to preferred embodiments thereof, it will be understood by those skilled in the art that various changes in form and details may be made thereto without departing from the spirit and scope of the invention as defined by the appended claims.

What is claimed is:

1. A method for manufacturing a solid state image pick-up device, the method comprising:

providing a semiconductor substrate having a front side on which a solid state image pick-up device may be formed, and a rear side opposite to the front side;

forming a polysilicon layer including impurities for gettering having a predetermined concentration on the rear side of the semiconductor substrate by introducing the impurities for gettering to a level of the solid solubility in silicon into the polysilicon layer; and reducing the thickness of the polysilicon layer including the impurities for gettering, thereby condensing the impurities for gettering into the reduced polysilicon layer, such that the resulting reduced polysilicon layer has an impurity concentration greater than the solid solubility in silicon and such that the resulting reduced polysilicon layer has a thickness less than its deposition thickness.

2. The method of claim 1, wherein the step of reducing the thickness of the polysilicon layer is performed by oxidizing a predetermined thickness of the polysilicon layer.

3. The method of claim 1, wherein the step of reducing the thickness of the polysilicon layer is performed so that the polysilicon layer is reduced to ½ through 1/10 of its deposition thickness.

4. The method of claim 1, wherein the impurities for gettering comprise phosphorus (P) ions, or arsenic (As) ions.

5. The method of claim 4, wherein the step of forming a polysilicon layer including impurities for gettering on the rear side of the semiconductor substrate comprises:

depositing an intrinsic polysilicon layer on the rear side of the semiconductor substrate; and introducing the polysilicon layer with the impurities for gettering.

6. The method of claim 5, wherein the step of introducing the polysilicon layer with the impurities for gettering is performed by ion implantation, doping, or diffusion into the polysilicon layer.

7. The method of claim 1, wherein the step of forming a polysilicon layer including impurities for gettering, on the rear side of the semiconductor substrate is performed by depositing the polysilicon layer in which the impurities for gettering are doped, on the rear side of the semiconductor substrate by a chemical vapor deposition (CVD) method.

8. A method for manufacturing a solid state image pick-up device, the method comprising:

providing a semiconductor substrate having a front side on which a solid state image pick-up device may be formed, and a rear side opposite to the front side;

forming a polysilicon layer including impurities for gettering having a predetermined concentration on the rear side of the semiconductor substrate by introducing the impurities for gettering to a level of the solid solubility in silicon into the polysilicon layer; and oxidizing a predetermined thickness of the polysilicon layer including the impurities for gettering and condensing the impurities for gettering into the polysilicon layer, such that the resulting polysilicon layer has an impurity concentration greater than the solid solubility in silicon;

wherein the step of oxidizing a predetermined thickness of the polysilicon layer is performed so that ½ through ¹⁄₁₀ of the deposition thickness of the polysilicon layer remains.

9. The method of claim 8, wherein the impurities for gettering are phosphorus (P) ions, or arsenic (As) ions.

10. The method of claim 9, wherein the step of forming a polysilicon layer including impurities for gettering on the rear side of the semiconductor substrate comprises:

depositing an intrinsic polysilicon layer on the rear side of the semiconductor substrate; and introducing the polysilicon layer with the impurities for gettering.

11. The method of claim 10, wherein the step of introducing the polysilicon layer with the impurities for gettering is performed by ion implantation, doping, or diffusion into the polysilicon layer.

12. The method of claim 9, wherein the step of forming a polysilicon layer including impurities for gettering, on the rear side of the semiconductor substrate is performed by depositing the polysilicon layer in which the impurities for gettering are doped, on the rear side of the semiconductor substrate by a chemical vapor deposition (CVD) method.

13. A method for manufacturing a solid state image pick-up device, the method comprising:

providing a semiconductor substrate having a front side on which a solid state image pick-up device may be formed, and a rear side opposite to the front side;

forming a polysilicon layer including impurities for gettering having a predetermined concentration on the rear side of the semiconductor substrate by introducing the impurities for gettering to a level of the solid solubility in silicon into the polysilicon layer;

oxidizing a predetermined thickness of the polysilicon layer including the impurities for gettering and condensing the impurities for gettering into the polysilicon layer, such that the resulting polysilicon layer has an impurity concentration greater than the solid solubility in silicon; and forming a protective layer for preventing out-diffusion of the impurities to cover the rear side of the semiconductor substrate.

14. The method of claim 13, wherein the step of oxidizing the polysilicon layer to a predetermined thickness is performed by oxidizing the thickness of the polysilicon layer so that ½ through ¹⁄₁₀ of the entire thickness of the polysilicon layer may remain.

15. The method of claim 14, wherein the impurities for gettering are phosphorus (P) ions, or arsenic (As) ions.

16. The method of claim 15, wherein the step of forming a polysilicon layer including impurities for gettering on the rear side of the semiconductor substrate comprises:

depositing an intrinsic polysilicon layer on the rear side of the semiconductor substrate; and introducing the polysilicon layer with the impurities for gettering.

17. The method of claim 16, wherein the step of introducing the polysilicon layer with the impurities for gettering is performed by ion implantation, doping, or diffusion.

18. The method of claim 15, wherein the step of forming a polysilicon layer including impurities for gettering, on the rear side of the semiconductor substrate is performed by depositing the polysilicon layer in which the impurities for gettering are doped, on the rear side of the semiconductor substrate by a chemical vapor deposition (CVD) method.

19. The method of claim 13, wherein the protective layer is formed of silicon nitride ($Si_3N_4$) or silicon oxynitride (SiON).

* * * * *